United States Patent
Kwak

(10) Patent No.: US 9,343,699 B2
(45) Date of Patent: May 17, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventor: Won-Kyu Kwak, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/262,757

(22) Filed: Apr. 27, 2014

(65) Prior Publication Data
US 2015/0060786 A1 Mar. 5, 2015

(30) Foreign Application Priority Data

Aug. 28, 2013 (KR) .................. 10-2013-0102658

(51) Int. Cl.
*H01L 29/08* (2006.01)
*H01L 51/52* (2006.01)
*H01L 27/32* (2006.01)
*H01L 51/05* (2006.01)

(52) U.S. Cl.
CPC ........ *H01L 51/5253* (2013.01); *H01L 27/3258* (2013.01); *H01L 51/0525* (2013.01)

(58) Field of Classification Search
CPC ... H01L 27/32–27/326; H01L 51/50–51/5287; H01L 2227/32–2227/326; H01L 2251/5323–2251/5361; H01L 2924/12044
See application file for complete search history.

(56) References Cited

U.S. PATENT DOCUMENTS

| | | | |
|---|---|---|---|
| 2004/0125314 A1* | 7/2004 | Choi ..................... | G02F 1/1339 349/153 |
| 2007/0159043 A1* | 7/2007 | Kubota et al. .................. | 313/110 |
| 2008/0224599 A1* | 9/2008 | Kim .............................. | 313/504 |
| 2010/0200846 A1* | 8/2010 | Kwack et al. ................... | 257/40 |
| 2013/0316475 A1* | 11/2013 | Yu et al. .......................... | 438/26 |

FOREIGN PATENT DOCUMENTS

| KR | 1020100005525 A | 1/2010 |
|---|---|---|
| KR | 1020110035444 A | 4/2011 |
| KR | 1020120075145 A | 7/2012 |

* cited by examiner

*Primary Examiner* — David Vu
*Assistant Examiner* — Cuong Nguyen
(74) *Attorney, Agent, or Firm* — Cantor Colburn LLP

(57) ABSTRACT

An organic light-emitting display apparatus including a substrate; a display unit which defines an active area of the substrate and includes a thin film transistor; concave-convex portions protruded from the substrate in an area outside the active area; and an encapsulation layer which encapsulates the display unit. The thin film transistor includes an active layer, a gate insulating layer on the active layer, a gate electrode, a source electrode, a drain electrode, and an interlayer insulating layer between the gate electrode and the source electrode, and between the gate electrode and the drain electrode. The concave-convex portions include portions of the gate insulating layer and the interlayer insulating layer, and the encapsulation layer covers the concave-convex portions.

10 Claims, 6 Drawing Sheets

ORGANIC LIGHT-EMITTING DISPLAY APPARATUS AND METHOD OF MANUFACTURING THE SAME

This application claims priority to Korean Patent Application No. 10-2013-0102658, filed on Aug. 28, 2013, and all the benefits accruing therefrom under 35 U.S.C. §119, the disclosure of which is incorporated herein in its entirety by reference.

BACKGROUND

1. Field

One or more exemplary embodiment of the invention relate to an organic light-emitting display apparatus and a method of manufacturing the same, and more particularly, to an organic light-emitting display apparatus including a thin film encapsulation layer having an improved encapsulation characteristic and a method of manufacturing the organic light-emitting display apparatus.

2. Description of the Related Art

An organic light-emitting display apparatus is a self-emissive display apparatus having an organic light-emitting device. The organic light-emitting device includes a hole injection electrode and an electron injection electrode, and an organic emission layer (organic EML) therebetween. A hole injected from the hole injection electrode and an electrode injected from the electron injection electrode are combined in the organic EML so that an exciton is generated from the combination and emits light when the exciton transitions from an exited state to a ground state.

The organic light-emitting display apparatus that is a self-emissive display apparatus does not require a separate light source, is capable of operating with a relatively low voltage, is capable of having a relatively light weight and slimness, and is expected to become a next generation display apparatus due to high display quality characteristics such as a wide viewing angle, high contrast and a fast response time.

SUMMARY

One or more exemplary embodiment of the invention include an organic light-emitting display apparatus including a thin film encapsulation layer having an improved encapsulation characteristic and a method of manufacturing the organic light-emitting display apparatus.

Additional features will be set forth in part in the description which follows and, in part, will be apparent from the description, or may be learned by practice of the exemplary embodiments described herein.

According to one or more exemplary embodiment of the invention, an organic light-emitting display apparatus includes a substrate; a display unit which defines an active area of the substrate and includes a thin film transistor; concave-convex portions protruded from the substrate in an area outside the active area; and an encapsulation layer which encapsulates the display unit. The thin film transistor includes an active layer, a gate insulating layer on the active layer, a gate electrode, a source electrode, a drain electrode, and an interlayer insulating layer between the gate electrode and the source electrode, and between the gate electrode and the drain electrode. The concave-convex portions include portions of the gate insulating layer and the interlayer insulating layer, and the encapsulation layer covers the concave-convex portions.

Each of the concave-convex portions may have a double-layer structure including the portions of the gate insulating layer and the interlayer insulating layer.

The encapsulation layer may include an inorganic layer, and the inorganic layer may contact the concave-convex portions.

The inorganic layer and the interlayer insulating layer may include a same material.

The inorganic layer and the gate insulating layer may include a same material.

The encapsulation layer may include a stacked structure including an organic layer and an inorganic layer, and the inorganic layer may contact the concave-convex portions.

The stacked structure may include more than one of the organic layer or the inorganic layer.

The inorganic layer and the interlayer insulating layer may include a same material.

The inorganic layer and the gate insulating layer may include a same material.

The organic light-emitting display apparatus may further include a protective layer between the encapsulation layer and the display unit.

According to one or more exemplary embodiment of the invention, an organic light-emitting display apparatus includes a substrate; a display unit which defines an active area of the substrate and includes a thin film transistor and an organic light-emitting device electrically connected to each other; and an encapsulation layer which encapsulates the display unit. The thin film transistor includes a gate insulating layer extending to an area outside the active area, and an interlayer insulating layer on the gate insulating layer and extending to the area outside the active area. Protruding portions are between the gate insulating layer and the interlayer insulating layer in the area outside the active area. The concave-convex portions are defined by the interlayer insulating layer in the area outside the active area, and the encapsulation layer covers the concave-convex portions.

Each of the stepped portions may include a metal layer.

The thin film transistor may further include an active layer, a gate electrode, a source electrode and a drain electrode. The interlayer insulating layer may be between the gate electrode and the source electrode, and between the gate electrode and the drain electrode. The display unit may further include an organic light-emitting device including a pixel electrode connected to the source electrode or the drain electrode; an intermediate layer on the pixel electrode and including an organic emission layer; and an opposite electrode on the intermediate layer. The protruding portions may include a same material as that of the gate electrode, the source electrode, the drain electrode or the pixel electrode.

The encapsulation layer may include an inorganic layer, and the inorganic layer may contact the concave-convex portions.

The inorganic layer and the interlayer insulating layer may include a same material.

The encapsulation layer may have a stacked structure including an organic layer and an inorganic layer, and the inorganic layer may contact the concave-convex portions.

The stacked structure may include more than one of the organic layer or the inorganic layer.

The inorganic layer and the interlayer insulating layer may include a same material.

The inorganic layer and the interlayer insulating layer may each include silicon nitride (SiNx).

The organic light-emitting display apparatus may further include a protective layer between the encapsulation layer and the display unit.

BRIEF DESCRIPTION OF THE DRAWINGS

These and/or other features will become apparent and more readily appreciated from the following description of the exemplary embodiments, taken in conjunction with the accompanying drawings of which.

DETAILED DESCRIPTION

Figure 1:
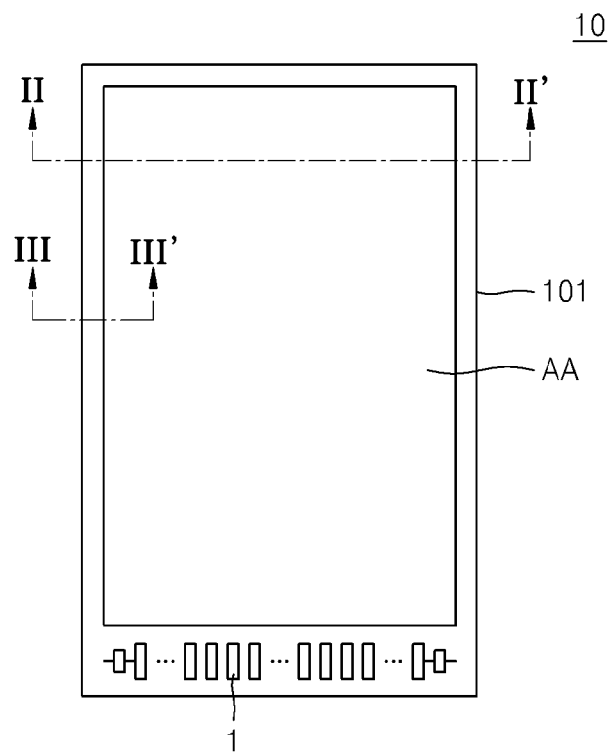
FIG. 1 is a plane view illustrating an exemplary embodiment of an organic light-emitting display apparatus according to the invention.

Reference will now be made in detail to exemplary embodiments, examples of which are illustrated in the accompanying drawings. In this regard, the exemplary embodiments may have different forms and should not be construed as being limited to the descriptions set forth herein. Accordingly, the exemplary embodiments are merely described below, by referring to the figures, to explain features of the invention. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Since an organic light-emitting display apparatus may deteriorate due to external moisture or oxygen, the organic light-emitting device is encapsulated to be protected from external moisture or oxygen.

In order to obtain slimness and/or flexibility of the organic light-emitting display apparatus, a thin film encapsulation ("TFE") such as including a plurality of inorganic layers or a plurality of layers including an organic layer and an inorganic layer, is used to encapsulate the organic light-emitting device.

The inorganic layer of the TFE may reduce or effectively prevent penetration of external moisture or oxygen, as a thickness of the inorganic layer is increased. However, when the thickness of the inorganic layer is increased, a stress of the inorganic layer is increased such that the inorganic layer may be delaminated from other layers in the organic light-emitting display apparatus. When the delamination of the inorganic layer occurs, external moisture or oxygen may penetrate into the organic light-emitting device such that a lifetime of the organic light-emitting display apparatus may be decreased. Therefore, there remains a need for an improved organic light-emitting display apparatus and organic light-emitting device in which delamination of the TFE is reduced and penetration of external moisture or oxygen is reduced or effectively prevented.

Hereinafter, the invention will be described in detail with reference to the accompanying drawings.

Figure 2:
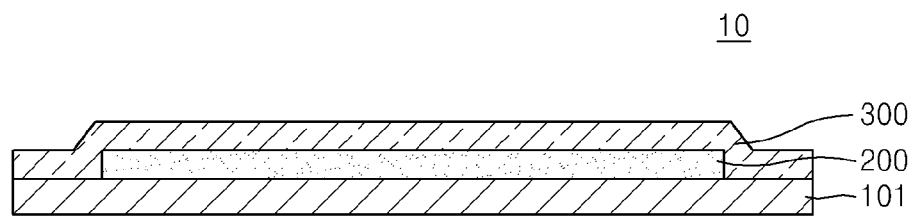
FIG. 2 is a cross-sectional view of the organic light-emitting display apparatus of FIG. 1, taken along line II-II'.
Figure 3:
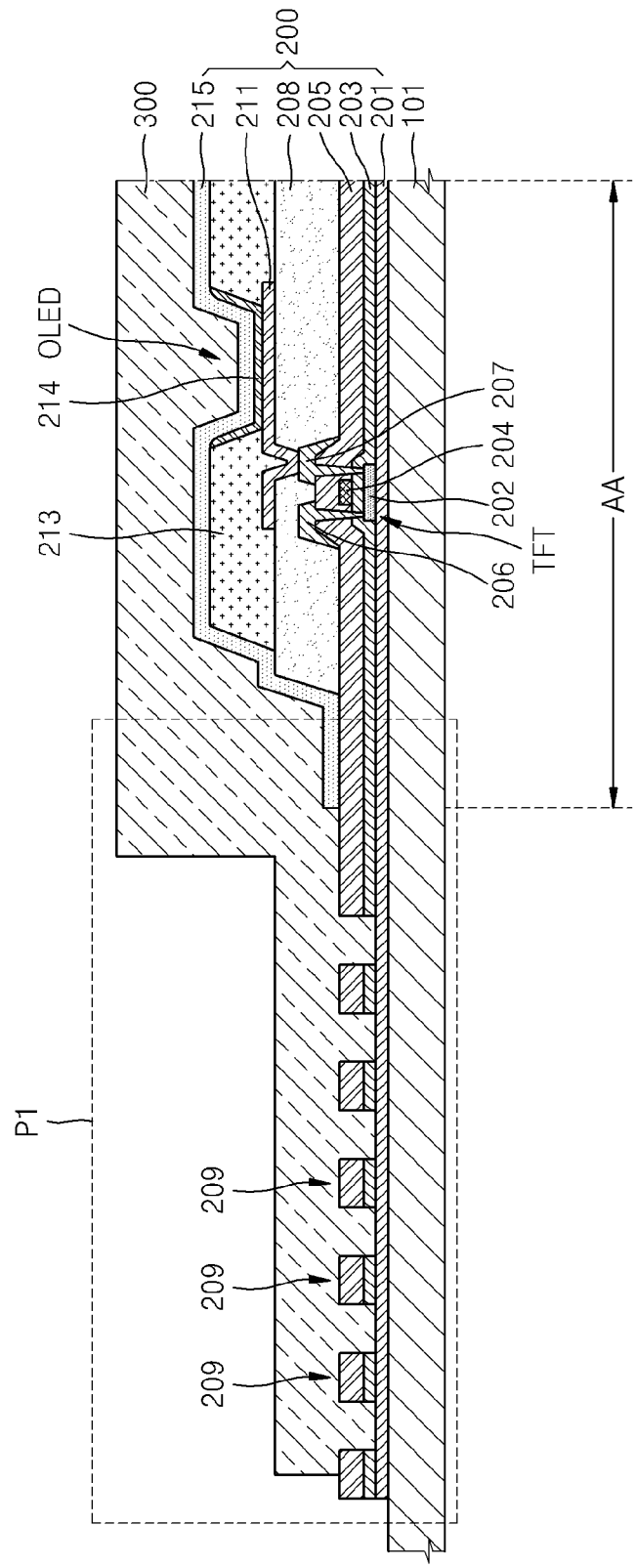
FIG. 3 is a cross-sectional view of the organic light-emitting display apparatus of FIG. 1, taken along line III-III'.
Figure 4:
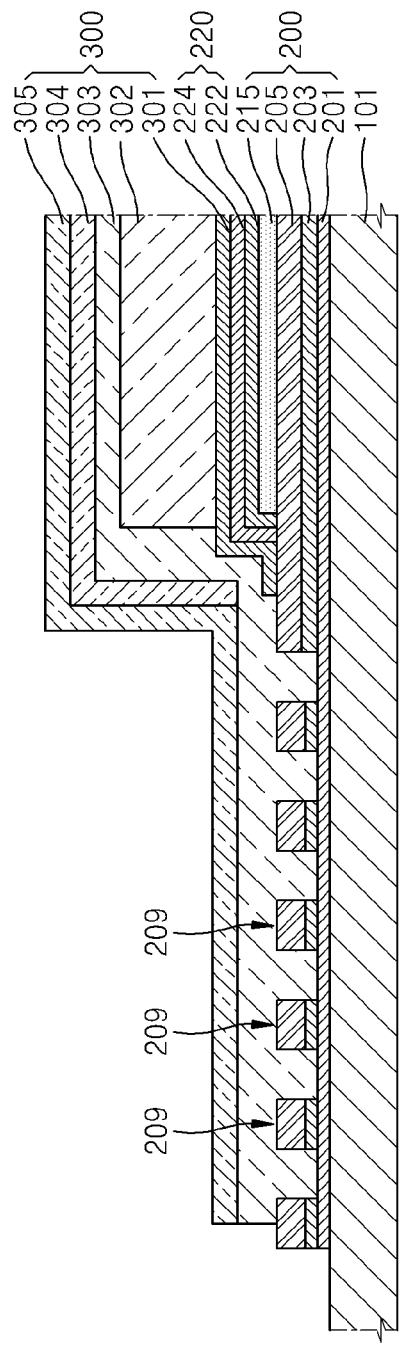
FIG. 4 is a magnified cross-sectional view illustrating portion P1 of FIG. 3.

FIG. 1 is a plane view illustrating an exemplary embodiment of an organic light-emitting display apparatus 10 according to the invention. FIG. 2 is a cross-sectional view of the organic light-emitting display apparatus 10 of FIG. 1, taken along line II-II'. FIG. 3 is a cross-sectional view of the organic light-emitting display apparatus 10 of FIG. 1, taken along line III-III'. FIG. 4 is a magnified cross-sectional view illustrating portion P1 of FIG. 3.

Referring to FIGS. 1 through 4, the organic light-emitting display apparatus 10 includes a substrate 101, a display unit 200 which defines an active area AA of the substrate 101 and/or the organic light-emitting display apparatus 10, and an encapsulation layer 300 which encapsulates the display unit 200. The active area AA may be a display area while an area outside the active area AA may be a peripheral or non-display area.

The substrate 101 may be a flexible substrate including a plastic material such as polyimide, polyethylene terephthalate ("PET"), polycarbonate, polyethylene naphthalate, polyarylate ("PAR"), polyetherimide ("PEI") or the like that have excellent heat-resistance and durability. However, the invention is not limited thereto, and the substrate 101 may include various materials such as including metal, glass or the like.

The display unit 200 defines the active area AA of the substrate 101 or the organic light-emitting display apparatus 10 and includes a thin film transistor TFT and an organic light-emitting device OLED that are electrically connected to each other. A plurality of pad units 1 is disposed around the active area AA, thereby transmitting an electric signal from a power supply device (not shown) or a signal generation device (not shown) to the active area AA.

Hereinafter, the display unit 200 is described in detail with reference to FIG. 3.

A buffer layer 201 may be disposed on the substrate 101. The buffer layer 201 may be on an entire top surface of the substrate 101, e.g., the buffer layer 201 may be disposed in the active area AA and an area outside of the active area AA. The buffer layer 201 may function to reduce or effectively prevent penetration of foreign substances via the substrate 101 and to provide a flat surface on the substrate 101. The buffer layer 201 may include various materials capable of performing the above-described functions.

In one exemplary embodiment, for example, the buffer layer 201 may be a composite layer of two or more layers such as an inorganic material layer including silicon oxide, silicon nitride, silicon oxynitride, aluminum oxide, aluminum nitride, titanium oxide, titanium nitride, or the like, and an organic material layer including polyimide, polyester, acryl or the like.

The thin film transistor TFT may be disposed on the buffer layer 201. The thin film transistor TFT may include an active layer 202, a gate electrode 204, a source electrode 206 and a drain electrode 207.

The active layer 202 may include an inorganic semiconductor such as amorphous silicon or polysilicon, an organic semiconductor, or an oxide semiconductor. The active layer 212 may include a source region, a drain region, and a channel region respectively corresponding to the source, drain and gate electrodes 206, 207 and 204.

A gate insulating layer 203 is disposed on the active layer 202. The gate insulating layer 203 may correspond to the entire top surface of the substrate 101. That is, the gate insulating layer 203 may correspond to the active area AA and the area outside of the active area AA. The gate insulating layer 203 may insulate the active layer 202 from the gate electrode 204. The gate insulating layer 203 may include an organic material, or an inorganic material including SiNx, SiO$_2$, or the like.

The gate electrode 204 is disposed on the gate insulating layer 203. The gate electrode 204 may include Au, Ag, Cu, Ni, Pt, Pd, Al, Mo, or an alloy of Al:Nd or Mo:W. However, the invention is not limited thereto, and the gate electrode 204 may include various materials in consideration of a design condition of the organic light-emitting display apparatus 10.

An interlayer insulating layer 205 is disposed on the gate electrode 204. The interlayer insulating layer 205 may correspond to the entire top surface of the substrate 101. That is, the interlayer insulating layer 205 may correspond to the active area AA and the outer area of the active area AA.

The interlayer insulating layer 205 is disposed between the gate electrode 204 and the source electrode 206, and between the gate electrode 204 and the drain electrode 207 so as to respectively obtain insulation therebetween. The interlayer insulating layer 205 may include an inorganic material including SiNx, SiO$_2$, or the like.

Concave-convex portions 209 may be disposed in the area outside of the active area AA. The concave-convex portions 209 may be disposed on the buffer layer 201.

Each of the concave-convex portions 209 may have a double-layer structure including the gate insulating layer 203 and the interlayer insulating layer 205. In an exemplary embodiment of manufacturing the organic light-emitting display apparatus 10, the concave-convex portions 209 may be formed by patterning the gate insulating layer 203 and the interlayer insulating layer 205. A region of the organic light-emitting display apparatus 10 in which the concave-convex portions 209 are formed may be considered to have an embossed shape. The concave-convex portions 209 are covered by the encapsulation layer 300. Due to the repeating protruding and recessed shape defined by the concave-convex portions 209, a contact area between the encapsulation layer 300 and each of the gate and interlayer insulating layers 203 and 205 is increased. Thus, adhesion between the encapsulation layer 300 and each of the gate and interlayer insulating layers 203 and 205 is improved, so that delamination of the encapsulation layer 300 may be reduced or effectively prevented, and by doing so, penetration of external moisture or oxygen to organic light-emitting device OLED may be efficiently reduced or effectively prevented. Also, because portions of the gate insulating layer 203 and the interlayer insulating layer 205 are absent between and around the concave-convex portions 209, a strain in and below the encapsulation layer 300 due to occurrence of a stress may be decreased.

The source electrode 206 and the drain electrode 207 are disposed on the interlayer insulating layer 205. In more detail, the interlayer insulating layer 205 and the gate insulating layer 203 expose the source region and the drain region of the active layer 202, and the source electrode 206 and the drain electrode 207 respectively contact the exposed source and drain regions of the active layer 202. In an exemplary embodiment of manufacturing the organic light-emitting display apparatus 10, the concave-convex portions 209 may be formed by a process in which the interlayer insulating layer 205 and the gate insulating layer 203 are formed to expose the source region and the drain region of the active layer 202, such that an additional process to form the concave-convex portions 209 is omitted.

While FIG. 3 illustrates a top gate type thin film transistor TFT that sequentially includes the active layer 202, the gate electrode 204, the source electrode 206 and the drain electrode 207, the invention is not limited thereto, and the gate electrode 204 may be disposed below the active layer 202 in a bottom gate type thin film transistor TFT.

The thin film transistor TFT is electrically connected to the organic light-emitting device OLED and drives the organic light-emitting device OLED. The thin film transistor TFT is covered by a passivation layer 208.

The passivation layer 208 may include an inorganic insulating layer and/or an organic insulating layer. The inorganic insulating layer may include $SiO_2$, silicon nitride (SiNx), silicon oxynitride (SiON), $Al_2O_3$, $TiO_2$, $Ta_2O_5$, $HfO_2$, $ZrO_2$, barium strontium titanate ("BST"), lead zirconate titanate ("PZT") or the like, and the organic insulating layer may include polymer derivatives having a commercial polymer such as poly(methyl methacrylate) ("PMMA") and polystyrene ("PS) and a phenol group, an acryl-based polymer, an imide-based polymer, an allyl ether-based polymer, an amide-based polymer, a fluorine-based polymer, a p-xylene-based polymer, a vinylalcohol-based polymer or a combination thereof. The passivation layer 208 may have a multi-layer structure including the inorganic insulating layer and the organic insulating layer.

The organic light-emitting device OLED may be disposed on the passivation layer 208, and may include a pixel electrode 211, an intermediate layer 214 and an opposite electrode 215.

The pixel electrode 211 is disposed on the passivation layer 208. In more detail, the passivation layer 208 may expose a predetermined region of the drain electrode 207 without covering an entire portion of the drain electrode 207, and the pixel electrode 211 may be connected to the exposed portion of the drain electrode 207.

In the illustrated exemplary embodiment, the pixel electrode 211 may be a reflective electrode. The pixel electrode 211 may include a reflective material layer including Ag, Mg, Al, Pt, Pd, Au, Ni, Nd, Ir, Cr or a combination thereof, and a transparent or translucent electrode layer disposed on the reflective layer. The transparent or translucent electrode layer may include indium tin oxide ("ITO"), indium zinc oxide ("IZO"), zinc oxide ("ZnO"), indium oxide ($In_2O_3$), indium gallium oxide ("IGO") aluminum zinc oxide ("AZO") or a combination thereof.

The opposite electrode 215 disposed to face the pixel electrode 211 may be a transparent or translucent electrode. The opposite electrode 215 may include a metal thin layer having a low work function and including Li, Ca, LiF/Ca, LiF/Al, Al, Ag, Mg or a combination thereof. Also, opposite electrode 215 may include an auxiliary electrode layer or a bus electrode, which includes a transparent electrode forming material such as ITO, IZO, ZnO, $In_2O_3$ or a combination thereof may be further disposed on the metal thin layer.

Thus, the opposite electrode 215 may transmit light emitted from an organic emission layer (organic EML) included in the intermediate layer 214. That is, the light emitted from the organic EML may be directly emitted toward the opposite electrode 215, or may be reflected from the pixel electrode 211 as a reflective electrode and then emitted toward the opposite electrode 215.

The organic light-emitting display apparatus 10 according to the invention is not limited to a top-emission type organic light-emitting display apparatus and alternatively may be a bottom-emission type organic light-emitting display apparatus in which light from the organic EML is emitted toward the substrate 101. In an exemplary embodiment of the bottom-emission type organic light-emitting display apparatus, the pixel electrode 211 may be a transparent or translucent electrode, and the opposite electrode 215 may be a reflective electrode. Also, in another alternative exemplary embodiment, the organic light-emitting display apparatus 10 according to the illustrated exemplary embodiment may be a dual-emission type organic light-emitting display apparatus in which light is emitted toward both top and bottom surfaces.

A pixel defining layer 213 including an insulating material is disposed on the pixel electrode 211. An opening defined in the pixel defining layer 213 exposes a predetermined region of the pixel electrode 211, and the intermediate layer 214 including the organic EML is disposed on the exposed region of the pixel electrode 211 and in the opening defined in the pixel defining layer 213.

The organic EML may be a relatively small-molecule organic layer or a polymer organic layer. In addition to the organic EML, the intermediate layer 214 may selectively further include a functional layer such as a hole transport layer ("HTL"), a hole injection layer ("HIL"), an electron transport layer ("ETL"), an electron injection layer ("EIL"), or the like.

The encapsulation layer 300 is disposed on the opposite electrode 215. The encapsulation layer 300 may include a first inorganic layer 301, a first organic layer 302 and a second inorganic layer 303. Also, a protective layer 220 may be further disposed between the encapsulation layer 300 and the display unit 200.

The protective layer 220 includes a capping layer 222 covering the opposite electrode 215, and a blocking layer 224 on the capping layer 222.

The capping layer 222 may include an organic material such as N,N'-diphenyl-N,N'-bis(1-naphthyl)-1,1'-biphenyl-4,4"-diamine ("a-NPD"), N,N'-di(naphthalene-1-yl)-N,N'-diphthalbenzidine ("NPB"), N,N'-diphenyl-N,N'-bis(3-methylphenyl)-(1,1'-biphenyl)-4,4'-diamine ("TPD"), 4,4',4"-Tris(N-3-methylphenyl-N-phenylamino)triphenylamine ("m-MTDATA"), tris(8-quinolinolato)aluminum ("$Alq_3$") copper phthalocyanine ("CuPc"), or the like. The capping layer 222 may function to protect the organic light-emitting device OLED and to help light, which is generated in the organic light-emitting device OLED, to be efficiently emitted from the organic light-emitting device OLED.

The blocking layer 224 may include an inorganic material such as lithium fluoride (LiF), magnesium fluoride ($MgF_2$), calcium fluoride ($CaF_2$) or the like. In an exemplary embodiment of manufacturing the organic light-emitting display apparatus 10, the blocking layer 224 may function to block plasma, which is used in forming the first inorganic layer 301, from penetrating into the organic light-emitting device OLED and then damaging elements thereof such as the intermediate layer 214, the opposite electrode 215 or the like. In the illustrated exemplary embodiment, the blocking layer 224 may include LiF having a pin-hole structure.

The first inorganic layer 301 is disposed on the protective layer 220. In one exemplary embodiment, for example, the first inorganic layer 301 may include an aluminum oxide (AlOx). The first inorganic layer 301 may have a preset cross-sectional thickness, formed in an exemplary embodiment of manufacturing the organic light-emitting display apparatus 10 such as by a sputtering method.

The first organic layer 302 is disposed on the first inorganic layer 301 and may have a preset cross-sectional thickness so as to planarize a step difference due to the pixel defining layer 213. The first organic layer 302 may include epoxy, acrylate, urethane-acrylate or a combination thereof. A planar area of the first organic layer 302 may be less than that of the first inorganic layer 301.

The second inorganic layer 303 may surround the first inorganic layer 301 and the first organic layer 302. That is, the first organic layer 302 is completely surrounded by the first inorganic layer 301 and the second inorganic layer 303, so that penetration of external moisture or oxygen may be efficiently reduced or effectively prevented.

The second inorganic layer 303 may include SiNx and may have a preset cross-sectional thickness formed in an exemplary embodiment of manufacturing the organic light-emitting display apparatus 10 such as by chemical vapor deposition ("CVD").

A planar area of the second inorganic layer 303 may be greater than that of the first inorganic layer 301 and may directly cover the concave-convex portions 209 in the area outside of the active area AA.

Also, the second inorganic layer 303 may include a same material as the interlayer insulating layer 205 and/or be in same layer as the interlayer insulating layer 2205. That is, in an exemplary embodiment of manufacturing the organic light-emitting display apparatus 10, when the second inorganic layer 303 is formed of SiNx and the interlayer insulating layer 205 is also formed of SiNx, adhesion between the second inorganic layer 303 and the interlayer insulating layer 205 may be improved, so that adhesion between the second inorganic layer 303 and the concave-convex portions 209 may be improved. In this manner, the second inorganic layer 303 has a cross-sectional thickness sufficient to cover particles, so that, although a layer stress is increased, delamination of the second inorganic layer 303 may be reduced or effectively prevented, and by doing so, penetration of external moisture or oxygen to the organic light-emitting device OLED may be efficiently reduced or effectively prevented.

Also, the second inorganic layer 303 may include a same material as the gate insulating layer 203. That is, in an exemplary embodiment of manufacturing the organic light-emitting display apparatus 10, when the second inorganic layer 303 is formed of SiNx and the gate insulating layer 203 is also formed of SiNx, adhesion between the second inorganic layer 303 and the gate insulating layer 203 may be improved, so that adhesion between the second inorganic layer 303 and the concave-convex portions 209 including portions of the gate insulating layer 203 may be improved. In this manner, the second inorganic layer 303 has a cross-sectional thickness sufficient to cover particles, so that, although a layer stress is increased, delamination of the second inorganic layer 303 may be reduced or effectively prevented, and by doing so, penetration of external moisture or oxygen to the organic light-emitting device OLED may be efficiently reduced or effectively prevented.

A second organic layer 304 and a third inorganic layer 305 may be disposed on the second inorganic layer 303. Although not illustrated, a fourth inorganic layer (not shown) including AlOx may be disposed on an exterior surface of the encapsulation layer 300.

The second organic layer 304 may include epoxy, acrylate, urethane-acrylate or a combination thereof, and may have a preset cross-sectional thickness. The second organic layer 304 may lessen a layer stress occurred in the first inorganic layer 301 and may evenly cover the particles or the like.

The third inorganic layer 305 covers the second organic layer 304. The third inorganic layer 305 contacts a top surface of the second inorganic layer 303 in the area outside the active area AA.

The third inorganic layer 305 may include a same material as the second inorganic layer 303. In one exemplary embodiment, for example, the third inorganic layer 305 may include SiNx. Thus, adhesion between the third inorganic layer 305 and the second inorganic layer 303 is improved, so that penetration of external moisture or oxygen to the organic light-emitting device OLED may be efficiently reduced and effectively prevented.

The encapsulation layer 300 may further include additional inorganic layers and organic layers that alternate with each other, and the number of times of stacking the inorganic and organic layers is not limited.

A protection film (not shown) is attached on a top surface of the encapsulation layer 300. In an exemplary embodiment where the protection film has strong adhesion, when the protection film is removed, the encapsulation layer 300 may be delaminated. In this regard, by further disposing the outermost fourth inorganic layer including AlOx and having weak adhesion with respect to the protection film, the delamination problem may be reduced or effectively prevented.

Figure 5:
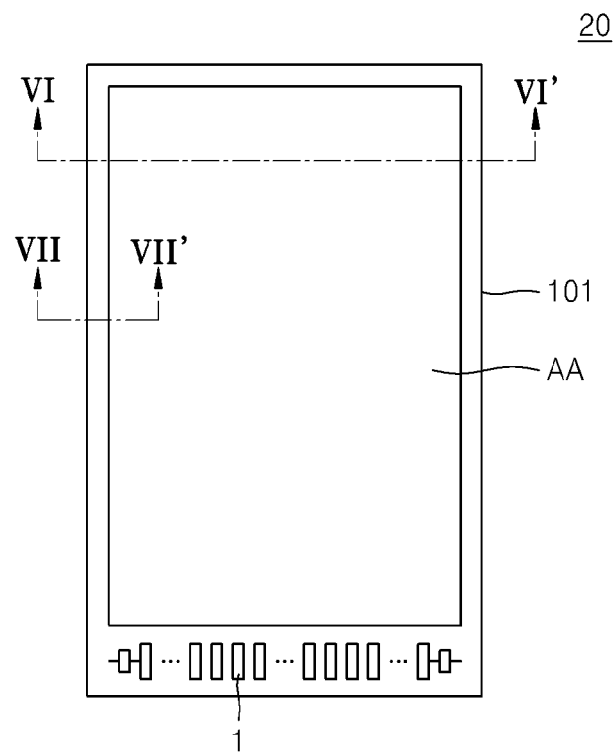
FIG. 5 is a plane view illustrating another exemplary embodiment of an organic light-emitting display apparatus according to the invention.
Figure 6:
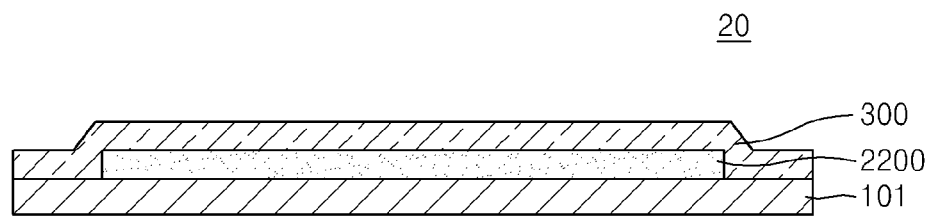
FIG. 6 is a cross-sectional view of the organic light-emitting display apparatus of FIG. 5, taken along line VI-VI'.
Figure 7:
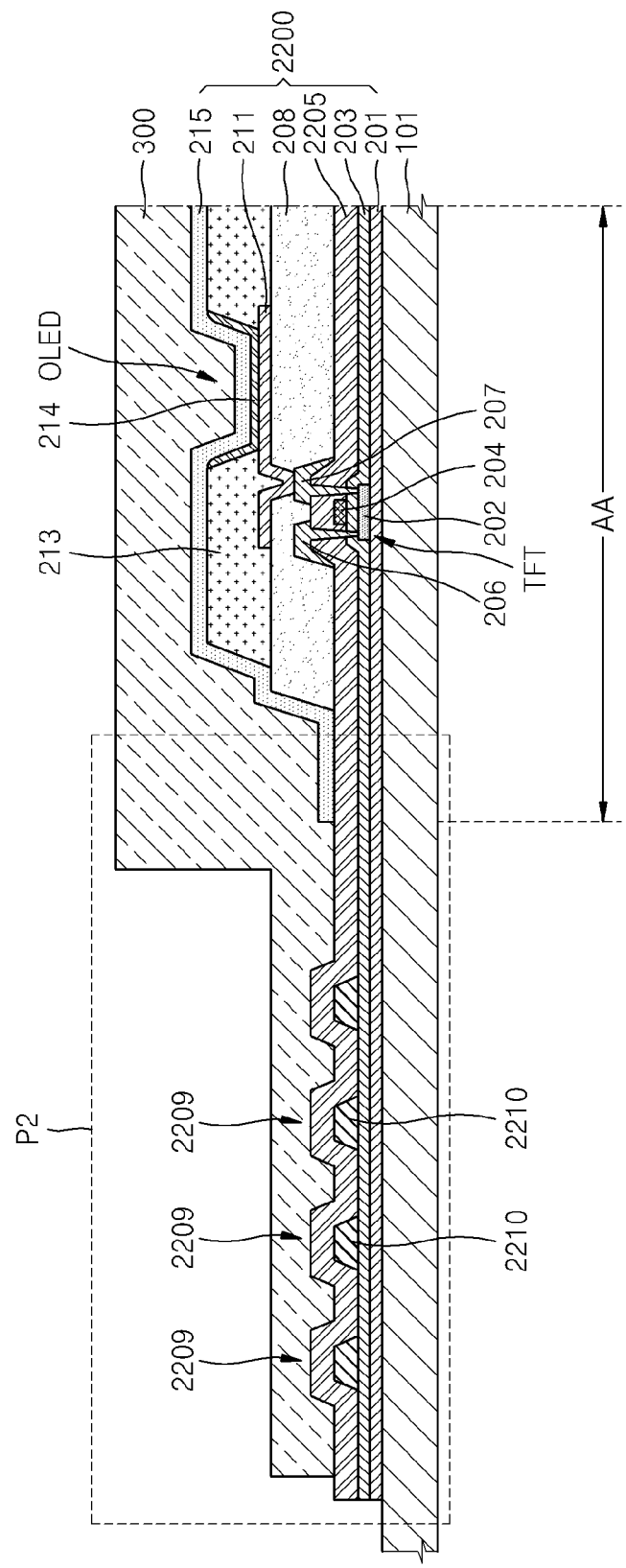
FIG. 7 is a cross-sectional view of the organic light-emitting display apparatus of FIG. 5, taken along line VII-VII'.
Figure 8:
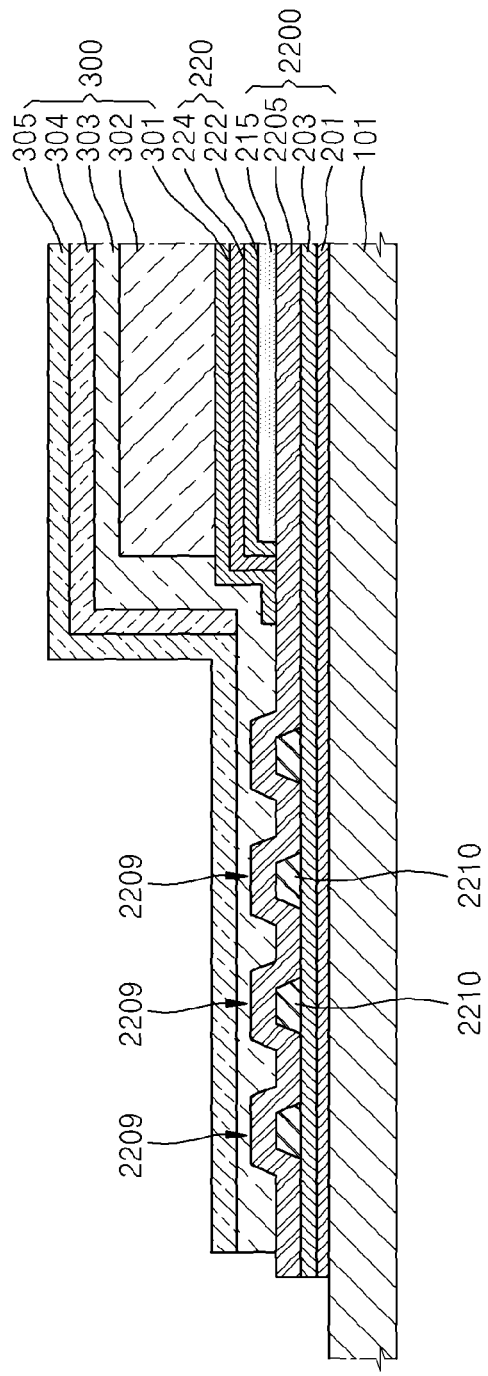
FIG. 8 is a magnified cross-sectional view illustrating portion P2 of FIG. 7.

FIG. 5 is a plane view illustrating another exemplary embodiment of an organic light-emitting display apparatus 20 according to the invention. FIG. 6 is a cross-sectional view of the organic light-emitting display apparatus 20 of FIG. 5, taken along line VI-VI'. FIG. 7 is a cross-sectional view of the organic light-emitting display apparatus 20 of FIG. 5, taken along line VII-VII'. FIG. 8 is a magnified cross-sectional view illustrating portion P2 of FIG. 7.

Hereinafter, the exemplary embodiment of FIGS. 5 through 8 will now be described with reference to differences with respect to the previous exemplary embodiment shown in FIGS. 1 through 4. Here, like reference numerals in FIGS. 5 through 8 refer to the like elements in FIGS. 1 through 4.

Referring to FIGS. 5 through 8, the organic light-emitting display apparatus 20 includes a substrate 101, a display unit 2200 which defines an active area AA of the substrate 101 and/or the organic light-emitting display apparatus 20, and an encapsulation layer 300 which encapsulates the display unit 2200.

Hereinafter, the display unit 2200 is described in detail with reference to FIG. 7.

A buffer layer 201 may be disposed on the substrate 101.

A thin film transistor TFT may be disposed on the buffer layer 201. The thin film transistor TFT may include an active layer 202, a gate electrode 204, a source electrode 206 and a drain electrode 207.

A gate insulating layer 203 is disposed on the active layer 202. The gate insulating layer 203 may correspond to an entire top surface of the substrate 101. That is, the gate insulating layer 203 may correspond to the active area AA and an area outside of the active area AA.

The gate electrode 204 is disposed on the gate insulating layer 203.

An interlayer insulating layer 2205 is disposed on the gate electrode 204. The interlayer insulating layer 2205 may correspond to the entire top surface of the substrate 101. That is, the interlayer insulating layer 2205 may correspond to the active area AA and the area outside of the active area AA.

The interlayer insulating layer 2205 is disposed between the gate electrode 204 and the source electrode 206, and between the gate electrode 204 and the drain electrode 207 so as to respectively obtain insulation therebetween. The interlayer insulating layer 2205 may include an inorganic material including SiNx, $SiO_2$, or the like.

Stepped portions 2210 may be disposed in the area outside of the active area AA and spaced apart from each other. The stepped portions 2210 may be disposed between the gate insulating layer 203 and the interlayer insulating layer 2205 in a cross-sectional thickness direction. Each of the stepped portions 2210 may include a metal layer. Each of the stepped portions 2210 may include a same material as that of the gate electrode 204, the source electrode 206 and/or a pixel electrode 211. Thus, in an exemplary embodiment of manufacturing the organic light-emitting display apparatus 10, the stepped portions 2210 may be formed by using the same method of forming the aforementioned electrodes so as to be in a same layer as the respective electrode.

Concave-convex portions 2209 may be disposed in the area outside of the active area AA. Since the interlayer insulating layer 2205 is disposed on the stepped portions 2210, the concave-convex portions 2209 may be formed by portions of the interlayer insulating layer 2205 due to a step difference between the stepped portions 2210 and the gate insulating layer 303.

A region in which the concave-convex portions 2209 are disposed may be considered to have an embossed shape. The concave-convex portions 2209 are covered by the encapsulation layer 300. Due to the repeating protruding and recessed shape defined by the concave-convex portions 2209, a contact area between the encapsulation layer 300 and the interlayer insulating layer 2205 is increased. Thus, adhesion between the encapsulation layer 300 and the interlayer insulating layer 2205 is improved, so that delamination of the encapsulation layer 300 may be reduced or effectively prevented, and by doing so, penetration of external moisture or oxygen to organic light-emitting device OLED may be efficiently reduced or effectively prevented The source electrode 206 and the drain electrode 207 are disposed on the interlayer insulating layer 2205.

The thin film transistor TFT is electrically connected to an organic light-emitting device OLED and drives the organic light-emitting device OLED, and is covered by a passivation layer 208.

The passivation layer 208 may include an inorganic insulating layer and/or an organic insulating layer.

The organic light-emitting device OLED may be disposed on the passivation layer 208, and may include a pixel electrode 211, an intermediate layer 214 and an opposite electrode 215.

A pixel defining layer 213 including an insulating material is disposed on the pixel electrode 211. An opening defined in the pixel defining layer 213 exposes a predetermined region of the pixel electrode 211, and the intermediate layer 214 including an organic EML is disposed on the exposed region of the pixel electrode 211 and in the opening defined in the pixel defining layer 213.

The encapsulation layer 300 is disposed on the opposite electrode 215. The encapsulation layer 300 may include a first inorganic layer 301, a first organic layer 302 and a second inorganic layer 303. Also, a protective layer 220 may be further disposed between the encapsulation layer 300 and the display unit 2200.

The protective layer 220 includes a capping layer 222 covering the opposite electrode 215, and a blocking layer 224 on the capping layer 222.

The first inorganic layer 301 is disposed on the protective layer 220. In one exemplary embodiment, for example, the first inorganic layer 301 may include AlOx.

The first organic layer 302 is disposed on the first inorganic layer 301 and may have a preset cross-sectional thickness so as to planarize a step difference due to the pixel defining layer 213. A planar area of the first organic layer 302 may be less than that of the first inorganic layer 301.

The second inorganic layer 303 may surround the first inorganic layer 301 and the first organic layer 302. That is, the first organic layer 302 is completely surrounded by the first inorganic layer 301 and the second inorganic layer 303, so that penetration of external moisture or oxygen may be efficiently reduced or effectively prevented.

The second inorganic layer 303 may include SiNx and may have a preset cross-sectional thickness formed in an exemplary embodiment of manufacturing the organic light-emitting display apparatus 10 such as by CVD.

A planar area of the second inorganic layer 303 may be greater than that of the first inorganic layer 301 and may directly cover the concave-convex portions 2209 in the area outside of the active area AA.

Also, the second inorganic layer 303 may include a same material as the interlayer insulating layer 2205 and/or be in same layer as the interlayer insulating layer 2205. That is, in an exemplary embodiment of manufacturing the organic light-emitting display apparatus 10, when the second inorganic layer 303 is formed of SiNx and the interlayer insulating layer 2205 is also formed of SiNx, adhesion between the second inorganic layer 303 and the interlayer insulating layer 2205 may be improved, so that adhesion between the second inorganic layer 303 and the concave-convex portions 2209 may be improved. In this manner, the second inorganic layer 303 has a cross-sectional thickness sufficient to cover particles, so that, although a layer stress is increased, delamination of the second inorganic layer 303 may be reduced or effectively prevented, and by doing so, penetration of external moisture or oxygen to the organic light-emitting device OLED may be efficiently reduced or effectively prevented.

A second organic layer 304 and a third inorganic layer 305 may be disposed on the second inorganic layer 303, and although not illustrated, a fourth inorganic layer (not shown) including of AlOx may be disposed on an exterior surface of the encapsulation layer 300.

The second organic layer 304 may lessen a layer stress occurring in the first inorganic layer 301 and may evenly cover the particles or the like.

The third inorganic layer 305 covers the second organic layer 304. The third inorganic layer 305 contacts a top surface of the second inorganic layer 303 in the area outside of the active area AA.

The third inorganic layer 305 may include a same material as the second inorganic layer 303. In one exemplary embodiment, for example, the third inorganic layer 305 may include SiNx. Thus, adhesion between the third inorganic layer 305 and the second inorganic layer 303 is improved, so that penetration of external moisture or oxygen to the organic light-emitting device OLED may be efficiently reduced or effectively prevented.

The encapsulation layer 300 may further include additional inorganic layers and organic layers that alternate with each other, and the number of times of stacking the inorganic and organic layers is not limited.

As described above, according to one or more of the above-described exemplary embodiments of the invention, delamination of an encapsulation layer may be reduced or effectively prevented so that penetration of external moisture or oxygen to the organic light-emitting device OLED may be efficiently reduced or effectively prevented.

It should be understood that the exemplary embodiments described herein should be considered in a descriptive sense only and not for purposes of limitation. Descriptions of features within each exemplary embodiment should typically be considered as available for other similar features in other exemplary embodiments.

While one or more exemplary embodiments of the invention have been described with reference to the figures, it will be understood by those of ordinary skill in the art that various changes in form and details may be made therein without departing from the spirit and scope of the invention as defined by the following claims.

What is claimed is:

1. An organic light-emitting display apparatus comprising:
a substrate;
a display unit which defines an active area of the substrate, the display unit comprising a thin film transistor and an organic light-emitting device which are connected to each other in the active area of the substrate;
concave-convex portions protruded from the substrate in an area outside the active area and spaced apart from each other; and
an encapsulation layer covering the thin film transistor and the organic light-emitting device in the active area of the substrate, to encapsulate the display unit on the substrate,
wherein
the thin film transistor comprises an active layer, a gate insulating layer on the active layer, a gate electrode, a source electrode, a drain electrode, and an interlayer insulating layer between the gate electrode and the source electrode, and between the gate electrode and the drain electrode,
the concave-convex portions comprise portions of the gate insulating layer and the interlayer insulating layer, and
the encapsulation layer covering the thin film transistor and the organic light-emitting device in the active area of the substrate is extended from the active area to the area outside the active area to contact the concave-convex portions comprising the portions of the gate insulating layer and the interlayer insulating layer.

2. The organic light-emitting display apparatus of claim 1, wherein each of the concave-convex portions has a double-layer structure comprising the portions of the gate insulating layer and the interlayer insulating layer.

3. The organic light-emitting display apparatus of claim 1, wherein
the encapsulation layer comprises an inorganic layer, and
the inorganic layer contacts the concave-convex portions.

4. The organic light-emitting display apparatus of claim 3, wherein the inorganic layer and the interlayer insulating layer comprise a same material.

5. The organic light-emitting display apparatus of claim 3, wherein the inorganic layer and the gate insulating layer comprise a same material.

6. The organic light-emitting display apparatus of claim 1, wherein
the encapsulation layer has a stacked structure comprising an organic layer and an inorganic layer, and
the inorganic layer contacts the concave-convex portions.

7. The organic light-emitting display apparatus of claim 6, wherein the stacked structure comprises more than one of the organic layer or the inorganic layer alternated with each other.

8. The organic light-emitting display apparatus of claim 6, wherein the inorganic layer and the interlayer insulating layer comprise a same material.

9. The organic light-emitting display apparatus of claim 6, wherein the inorganic layer and the gate insulating layer comprise a same material.

10. The organic light-emitting display apparatus of claim 1, further comprising a protective layer between the encapsulation layer and the display unit.

* * * * *